(12) United States Patent
Xie et al.

(10) Patent No.: US 10,869,396 B2
(45) Date of Patent: Dec. 15, 2020

(54) MOTHERBOARD TO BE CUT

(71) Applicants: BOE Technology Group Co., Ltd., Beijing (CN); Chengdu BOE Optoelectronics Technology Co., Ltd., Chengdu (CN)

(72) Inventors: Fuzheng Xie, Beijing (CN); Junshuo Li, Beijing (CN); Binfeng Feng, Beijing (CN); Xiaoxia Liu, Beijing (CN); Meiling Piao, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 302 days.

(21) Appl. No.: 15/968,860

(22) Filed: May 2, 2018

(65) Prior Publication Data

US 2019/0159343 A1 May 23, 2019

(30) Foreign Application Priority Data

Nov. 23, 2017 (CN) .......................... 2017 1 1181154

(51) Int. Cl.
*B23P 23/00* (2006.01)
*H05K 3/00* (2006.01)
(Continued)

(52) U.S. Cl.
CPC .......... *H05K 3/0052* (2013.01); *H05K 1/0269* (2013.01); *H01L 23/544* (2013.01); *H01L 51/56* (2013.01); *H01L 2223/5442* (2013.01); *H01L 2223/54453* (2013.01); *H01L 2223/54486* (2013.01); *H01L 2251/566* (2013.01); *H05K 2201/0909* (2013.01); *H05K 2201/09918* (2013.01); *H05K 2201/09936* (2013.01);
(Continued)

(58) Field of Classification Search
CPC ......... H05K 2203/0228; H05K 3/4638; H05K 2201/0909; H05K 2201/09936; H05K 3/0052; Y10T 29/49117; Y10T 29/49002; Y10T 29/5139
USPC ........ 29/564.3, 564.1, 566.1, 593, 762, 825, 29/829
See application file for complete search history.

(56) References Cited

U.S. PATENT DOCUMENTS

| | | | | |
|---|---|---|---|---|
| 7,129,124 | B2 * | 10/2006 | Hongo | H01L 21/2026 438/166 |
| 10,665,642 | B2 * | 5/2020 | Odaka | H01L 27/3223 |

\* cited by examiner

*Primary Examiner* — Thiem D Phan
(74) *Attorney, Agent, or Firm* — Westman, Champlin & Koehler, P.A.

(57) ABSTRACT

In one embodiment, a motherboard to be cut, includes: a motherboard body provided, on a surface thereof, with a cutting line comprising a special-shaped cutting line section, wherein, a plurality of positional marker groups are provided on a portion of the surface where the special-shaped cutting line section is provided; each positional marker group includes a first marker assembly and a second marker assembly provided at both sides of the special-shaped cutting line section; and, in the arrangement direction of the first marker assembly and the second marker assembly, size of the first marker assembly is not less than tolerance size of a side of the special-shaped cutting line section where the first marker assembly is in, and size of the second marker assembly is not less than tolerance size of a side of the special-shaped cutting line section where the second marker assembly is in.

10 Claims, 5 Drawing Sheets

(51) Int. Cl.
*H05K 1/02* (2006.01)
*H01L 51/56* (2006.01)
*H01L 23/544* (2006.01)

(52) U.S. Cl.
CPC ............... *H05K 2203/0228* (2013.01); *H05K 2203/163* (2013.01); *Y10T 29/5139* (2015.01)

MOTHERBOARD TO BE CUT

CROSS-REFERENCE TO RELATED APPLICATION

This application claims priority to Chinese Patent Application No. 201711181154.5 filed on Nov. 23, 2017 in the State Intellectual Property Office of China, the disclosure of which is hereby incorporated by reference in its entirety.

TECHNICAL FIELD

The present disclosure relates to the field of display technology, and particularly, to a motherboard to be cut, a method of manufacturing a substrate, and a method of detecting a cutting accuracy of a substrate.

BACKGROUND

Currently, in the development of OLED display, facing the use and requirements of different display devices, display panels of different shapes are required. In the preparation of a display panel, a motherboard is required to be cut into a substrate. In the related art, when detecting dimensions of a substrate and a combination thereof which have been subjected to chamfering or special-shaped cutting, a microscope is mainly used for a direct observation, and the cutting accuracy cannot be quantitatively detected, and thus the cutting accuracy and the quality of the substrate after the cutting cannot be accurately evaluated. It cannot be evaluated effectively whether or not the substrate will meet failure later.

SUMMARY

According to an aspect of the present disclosure, there is provided a motherboard to be cut, comprising: a motherboard body provided, on a surface thereof, with a cutting line comprising a special-shaped cutting line section, wherein, a plurality of positional marker groups are provided on a portion of the surface where the special-shaped cutting line section is provided, and the plurality of positional marker groups are distributed in an extension direction where the special-shaped cutting line section is in;

each of the plurality of positional marker groups comprises a first marker assembly provided at one side of the special-shaped cutting line section and a second marker assembly provided at the other side of the special-shaped cutting line section; a space for passing the special-shaped cutting line section therethrough is provided between the first marker assembly and the second marker assembly; the first marker assembly and the second marker assembly each comprise scale marks distributed in an arrangement direction of the first marker assembly and the second marker assembly; and, in the arrangement direction of the first marker assembly and the second marker assembly, a size of the first marker assembly is not less than a tolerance size of a side of the special-shaped cutting line section where the first marker assembly is in when the special-shaped cutting line section is cut, and a size of the second marker assembly is not less than a tolerance size of a side of the special-shaped cutting line section where the second marker assembly is in when the special-shaped cutting line section is cut.

In some embodiments, in each of the plurality of positional marker groups, a midline of the space along the extension direction where the special-shaped cutting line section is in coincides with a portion of the special-shaped cutting line section between the first marker assembly and the second marker assembly.

In some embodiments, in each of the plurality of positional marker groups, the scale marks of each of the first marker assembly and the second marker assembly comprise a plurality of strip-shaped marks arranged in the arrangement direction of the first marker assembly and the second marker assembly and distributed separately from one another and each extending parallel to an extension direction where the space is in.

In some embodiments, in each of the plurality of positional marker groups, a distance between any two adjacent ones of the strip-shaped marks of the first marker assembly is ranged between 1 μm~25 μm; and a distance between any two adjacent ones of the strip-shaped marks of the second marker assembly is ranged between 1 μm~25 μm.

In some embodiments, in each of the plurality of positional marker groups, the distance between any two adjacent ones of the strip-shaped marks of the first marker assembly and the distance between any two adjacent ones of the strip-shaped marks of the second marker assembly are equal to each other.

In some embodiments, in each of the plurality of positional marker groups, a size of each of the strip-shaped marks in the extension direction where the space is in is ranged between 100 μm~300 μm; and a size of each of the strip-shaped marks in the arrangement direction of the first marker assembly and the second marker assembly is ranged between 45 μm~55 μm.

In some embodiments, the motherboard body is a single-layer motherboard or a combined motherboard of multiple functional layers.

In some embodiments, in the cutting line, the special-shaped cutting line section is a curve-type cutting line segment; or the special-shaped cutting line section is a special-type cutting line section including a curve-type cutting line segment and a straight-type cutting line segment; or the special-shaped cutting line section is a special-type cutting line section including a plurality of straight-type cutting line segments.

In some embodiments, the cutting line comprises a profile cutting line for formation of a profile of a product and a groove cutting line for formation of a groove in the product.

In some embodiments, in each of the plurality of positional marker groups, the scale marks of each of the first marker assembly and the second marker assembly comprise a plurality of circular marks arranged in the arrangement direction of the first marker assembly and the second marker assembly and distributed separately from one another.

According to another aspect of the present disclosure, there is provided a method of manufacturing a substrate, and the method is implemented on the motherboard to be cut according to any of the abovementioned aspect and embodiments and comprises the following steps of:

before cutting the motherboard to be cut, forming, on the surface of the motherboard body, the cutting line comprising the special-shaped cutting line section;

forming the plurality of positional marker groups on the portion of the surface, where the special-shaped cutting line section is provided, of the motherboard body, the plurality of positional marker groups being distributed in the extension direction where the special-shaped cutting line section is in; wherein, each of the plurality of positional marker groups comprises a first marker assembly provided at one side of the special-shaped cutting line section and a second marker assembly provided at the other side of the special-shaped cutting line section; a space for passing the special-shaped cutting line section therethrough is provided between the first marker assembly and the second marker assembly; the first marker assembly and the second marker assembly each comprise scale marks distributed in an arrangement direction of the first marker assembly and the second marker assembly; and, in the arrangement direction of the first marker assembly and the second marker assembly, a size of the first marker assembly is not less than a tolerance size of a side of the special-shaped cutting line section where the first marker assembly is in when the special-shaped cutting line section is cut, and a size of the second marker assembly is not less than a tolerance size of a side of the special-shaped cutting line section where the second marker assembly is in when the special-shaped cutting line section is cut;

cutting the motherboard along the cutting line, to form the substrate;

determining a cutting accuracy by observing relative position(s) between the first marker assembly and/or the second marker assembly of each of the plurality of positional marker groups and corresponding cutting edge(s), and evaluating a cutting quality of the substrate in accordance with the cutting accuracy.

In some embodiments, in the abovementioned method, the determining a cutting accuracy by observing relative position(s) between the first marker assembly and/or the second marker assembly of each of the plurality of positional marker groups and corresponding cutting edge(s) comprises: obtaining an actual value for cutting deviation by observing relative position(s) between the cutting edge(s) and corresponding scale marks of the first marker assembly and/or the second marker assembly; and comparing the actual value with a preset value for cutting deviation, to obtain the cutting accuracy.

According to yet another aspect of the present disclosure, there is provided a method of detecting a cutting accuracy of a substrate, wherein the substrate is obtained from the motherboard to be cut according to any of the abovementioned aspect and embodiments, and the method comprises:

determining a cutting accuracy by observing relative position(s) between the first marker assembly and/or the second marker assembly of each of the plurality of positional marker groups and corresponding cutting edge(s), and evaluating a cutting quality of the substrate in accordance with the cutting accuracy.

DETAILED DESCRIPTION OF THE EMBODIMENTS

A clear and complete description of technical solutions in embodiments of the present disclosure will be made as below in conjunction with the accompanying drawings in the embodiments of the present disclosure. Apparently, the described embodiments are some of the embodiments of the present disclosure rather than all of the embodiments of the present disclosure. All other embodiments derived by those skilled in the art based on the embodiments of the present disclosure without making a creative work shall fall within the protection scope of the present disclosure.

Figure 1:
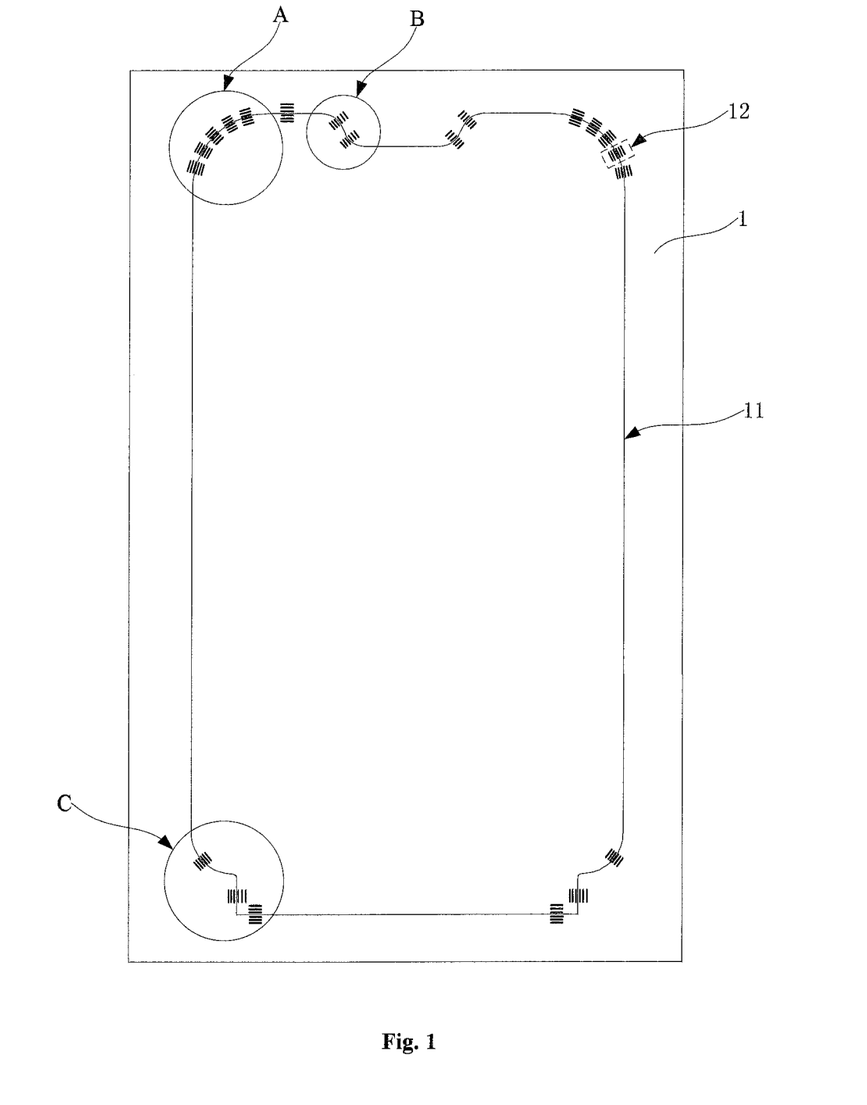
FIG. 1 is a front view showing a motherboard to be cut according to an embodiment of the present disclosure.
Figure 2:
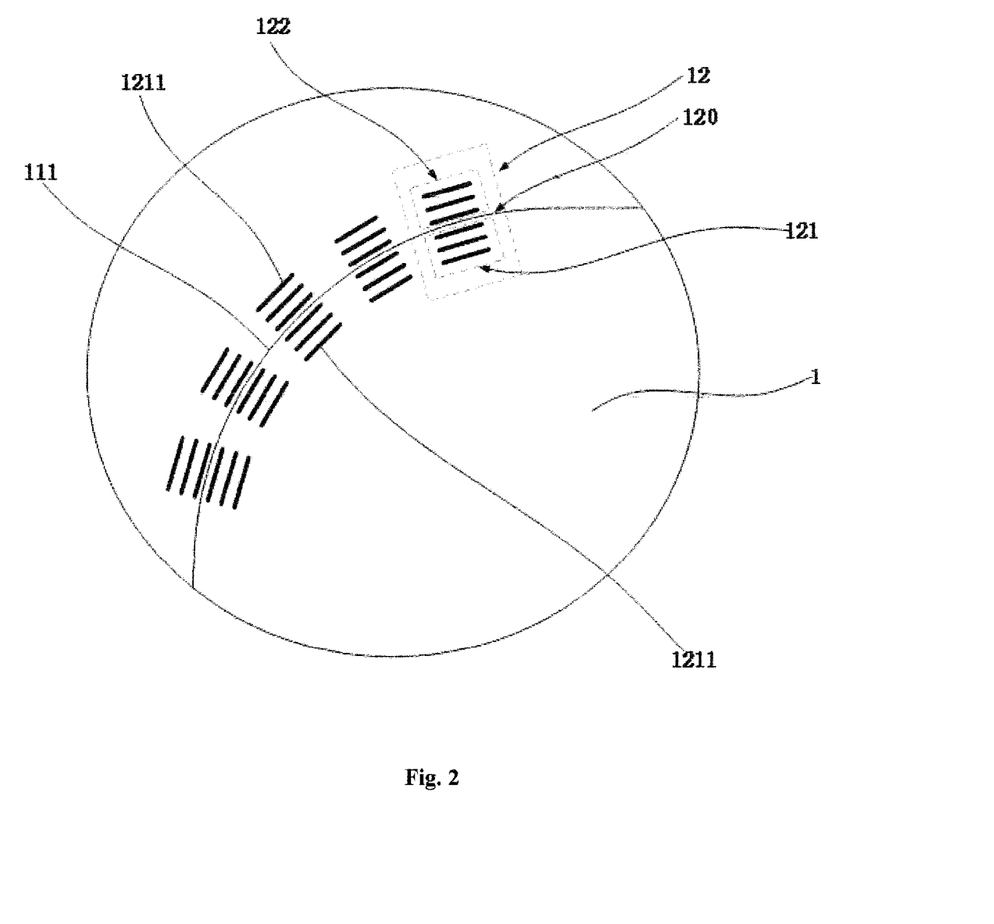
FIG. 2 is a partial enlarged schematic view showing a place A of FIG. 1.

FIG. 1 is a front view showing a motherboard to be cut according to an embodiment of the present disclosure. In FIG. 1, places A, B, C are special-shaped cutting line sections of a cutting line 11 located in different portions, respectively, and FIG. 2 is a partial enlarged schematic view showing the place A of FIG. 1. Please referring to FIG. 1 and FIG. 2, according to an embodiment of the present disclosure, there is provided a motherboard to be cut comprising: a motherboard body 1 provided, on a surface thereof, with a cutting line 11 comprising a special-shaped cutting line section 111 (for example, at the places A, B and C of FIG. 1). A plurality of positional marker groups 12 are provided on a portion of the surface where the special-shaped cutting line section 111 is provided, and the plurality of positional marker groups 12 are distributed in an extension direction where the special-shaped cutting line section 111 is in.

Each of the plurality of positional marker groups 12 comprises a first marker assembly 121 provided at one side of the special-shaped cutting line section and a second marker assembly 122 provided at the other side of the special-shaped cutting line section. A space 120 for passing the special-shaped cutting line section 111 therethrough is provided between the first marker assembly 121 and the second marker assembly 122. The first marker assembly 121 and the second marker assembly 122 each comprises scale marks distributed in an arrangement direction of the first marker assembly 121 and the second marker assembly 122. And, in the arrangement direction of the first marker assembly 121 and the second marker assembly 122, a size of the first marker assembly 121 is not less than a tolerance size of a side of the special-shaped cutting line section 111 where the first marker assembly 121 is in when the special-shaped cutting line section 111 is cut, and a size of the second marker assembly 122 is not less than a tolerance size of a side of the special-shaped cutting line section 111 where the second marker assembly 122 is in when the special-shaped cutting line section 111 is cut.

In the above motherboard to be cut, the cutting line 11 is provided on the surface of the motherboard body 1. The cutting line 11 comprises a profile cutting line for formation of a profile of a product or a groove cutting line for formation of a groove in the motherboard body. Namely, shape of the cutting line 11 is determined in accordance with product requirements. The cutting line 11 comprises a special-shaped cutting line section 111, which is a section of the cutting line where a special-shaped portion of the profile of a product to be formed is in. A desired product is achieved after cutting the motherboard along the cutting line 11. A profile cutting line for formation of a profile of a desired product is taken as an example hereinafter. A plurality of positional marker groups 12 are provided on a portion of the surface where the special-shaped cutting line section 111 is provided, and the plurality of positional marker groups 12 are distributed in an extension direction where the special-shaped cutting line section 111 is in. Each of the plurality of positional marker groups 12 comprises a first marker assembly 121 provided at one side of the special-shaped cutting line section and a second marker assembly 122 provided at the other side of the special-shaped cutting line section. A space 120 for passing the special-shaped cutting line section 111 therethrough is provided between the first marker assembly 121 and the second marker assembly 122. The first marker assembly 121 and the second marker assembly 122 each comprise scale marks distributed in an arrangement direction of the first marker assembly 121 and the second marker assembly 122. And, in the arrangement direction of the first marker assembly 121 and the second marker assembly 122, a size of the first marker assembly 121 is not less than a tolerance size of a side of the special-shaped cutting line section 111 where the first marker assembly 121 is in when the special-shaped cutting line section 111 is cut, and a size of the second marker assembly 122 is not less than a tolerance size of a side of the special-shaped cutting line section 111 where the second marker assembly 122 is in when the special-shaped cutting line section 111 is cut. With the motherboard to be cut according to the embodiments of the present disclosure, when a desired product is achieved after completely cutting the motherboard along the cutting line 11, a cutting edge is formed at side edge of the product. At the place of the special-shaped cutting line section, relative position(s) between a corresponding section of the cutting edge and the scale mark(s) of the first marker assembly 121 and/or the second marker assembly 122 can be observed directly, so that an actual value for cutting deviation can be achieved. Then, the actual value is compared with a preset value for cutting deviation, so that a cutting accuracy of the product can be judged accurately by quantitative detection on the cutting accuracy. Thus, cutting quality of the product can be effectively evaluated, and it is beneficial to the defective analysis at later stage. In addition, detection of the cutting accuracy by the use of the above-mentioned positional marker groups 12 is intuitive, efficient, convenient and simple.

Therefore, with the motherboard to be cut according to the embodiments of the present disclosure, after cutting the motherboard to be cut along the cutting line 11, a quantitative detection on the cutting accuracy of the product can be done by observing relative position(s) between a section of the cutting edge and the scale mark(s) (, especially at the place of the special-shaped cutting line section). Thus, cutting quality of the product can be effectively evaluated, and it is beneficial to the defective analysis at later stage. In addition, it is intuitive, efficient, convenient and simple.

Specifically, a laser cutting, or other cutting manners that can complete the motherboard cutting, can be adopted as the cutting method, and the embodiments of the present disclosure are not limited thereto.

In some embodiments, in each of the plurality of positional marker groups 12, a midline of the space 120 along the extension direction where the special-shaped cutting line section 111 is in coincides with a portion of the special-shaped cutting line section 111 between the first marker assembly 121 and the second marker assembly 122. That is, in each of the plurality of positional marker groups 12, the first marker assembly 121 and the second marker assembly 122 respectively at both sides of the special-shaped cutting line section 111 seem to be symmetric with respect to the corresponding special-shaped cutting line section 111. In an example, as shown in FIG. 2, the special-shaped cutting line section 111 of the cutting line is a curve-type cutting line segment, and the first marker assembly 121 and the second marker assembly 122 respectively at both sides of the special-shaped cutting line section 111 seem to be symmetric with respect to the corresponding curve-type (special-shaped) cutting line section 111. In another example, the special-shaped cutting line section 111 of the cutting line is a special-type cutting line section including a plurality of straight-type cutting line segments (as shown in FIG. 4c), and the first marker assembly 121 and the second marker assembly 122 respectively at both sides of the special-shaped cutting line section 111 are substantially symmetric with respect to the corresponding special-shaped cutting line section 111. By observing a relative position between a cutting edge of the special-shaped cutting line section and the first marker assembly 121 or the second marker assembly 122, it is beneficial to achieve an actual value for cutting deviation.

In some embodiments, in each of the plurality of positional marker groups 12, the scale marks of each of the first marker assembly 121 and the second marker assembly 122 comprise a plurality of strip-shaped marks 1211 arranged in the arrangement direction of the first marker assembly 121 and the second marker assembly 122 and distributed separately from one another, and each of the plurality of strip-shaped marks 1211 extends parallel to an extension direction where the space 120 is in. The strip-shaped marks 1211 is provided to match a shape of the special-shaped cutting line section 111, which is easy to observe. It should be noted that, the scale marks of each of the first marker assembly 121 and the second marker assembly 122 may also comprise a plurality of circular marks arranged in the arrangement direction of the first marker assembly 121 and the second marker assembly 122 and distributed separately from one another, or else the scale marks may have other shape, and the embodiments of the present disclosure are not limited thereto.

In some embodiments, in each of the plurality of positional marker groups 12, both the first marker assembly 121 and the second marker assembly 122 are integral with the motherboard body 1. In the arrangement direction of the first marker assembly 121 and the second marker assembly 122, scale marks are formed from a plurality of protrusions arranged at either side of the first marker assembly 121 and the second marker assembly 122 and spaced uniformly. In this way, because both the first marker assembly 121 and the second marker assembly 122 are integral with the motherboard body 1, during an actual cutting, if a cutting trajectory falls within the first marker assembly 121 or the second marker assembly 122, that is, if the cutting trajectory destroys the overall marker structure of the first marker assembly 121 or the second marker assembly 122, it is easy and convenient to observe deviation of the cutting trajectory from the cutting line. Thus, because both the first marker assembly 121 and the second marker assembly 122 are integral with the motherboard body 1, it is more convenient to observe whether or not the cutting trajectory deviates from the cutting line, which is beneficial for observation of the cutting accuracy. In the case that the cutting trajectory deviates from the cutting line, an actual value for cutting deviation can be obtained by observing a relative position between the cutting edge and the protrusions at both sides of first marker assembly 121 or the second marker assembly 122, so that the cutting accuracy is obtained. It facilitates improvement of an accuracy of detection of the cutting accuracy.

In some embodiments, in each of the plurality of positional marker groups 12, a distance between any two adjacent ones of the strip-shaped marks 1211 of the first marker assembly 121 is ranged between 1 μm~25 μm; and a distance between any two adjacent ones of the strip-shaped marks 1211 of the second marker assembly 122 is ranged between 1 μm~25 μm. Requirements on the cutting accuracy depend on different profiles of a product cut from the motherboard. Once the cutting line 11 of the motherboard is formed, the distance between any two adjacent ones of the strip-shaped marks 1211 at both sides of the cutting line 11 is selected in accordance with the cutting accuracy required for the product, which is advantageous to improve the accuracy of detection of the cutting accuracy.

In some embodiments, in each of the plurality of positional marker groups 12, the distance between any two adjacent ones of the strip-shaped marks 1211 of the first marker assembly 121 and the distance between any two adjacent ones of the strip-shaped marks 1211 of the second marker assembly 122 are equal to each other. It facilitates the worker to analyze the observation results and helps on judging the cutting accuracy.

In some embodiments, in each of the plurality of positional marker groups 12, a size of each of the strip-shaped marks 1211 in the extension direction where the space 120 is in is ranged between 100 μm~300 μm; and a size of each of the strip-shaped marks 1211 in the arrangement direction of the first marker assembly 121 and the second marker assembly 122 is ranged between 45 μm~55 μm. The size of each of the strip-shaped marks 1211 may be determined in accordance with the shape of the special-shaped cutting line section 111. Selection of suitable size of the strip-shaped mark 1211 facilitates improvement of the accuracy of detection of the cutting accuracy.

Figure 5A:
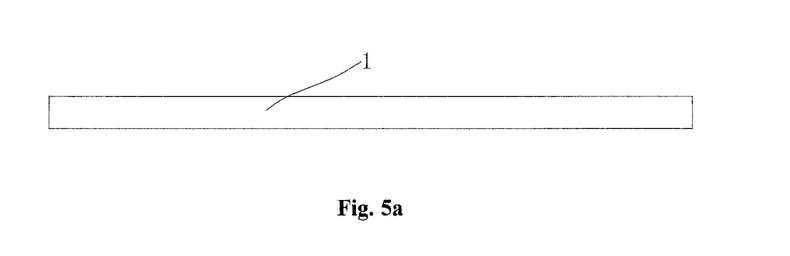
FIG. 5a is a sectional view of a motherboard according to an embodiment of the present disclosure.
Figure 5B:
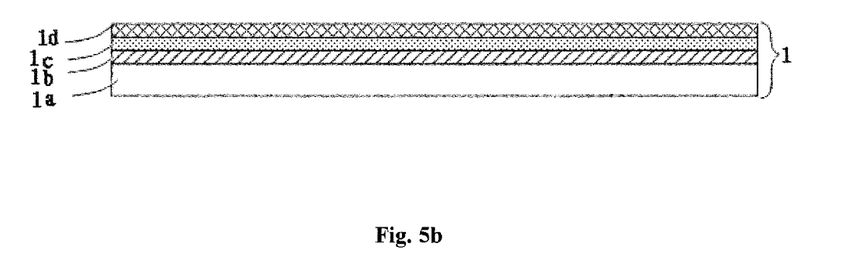
FIG. 5b is a sectional view of another motherboard according to an embodiment of the present disclosure.

In some embodiments, the motherboard body 1 is a single-layer motherboard or a combined motherboard of a plurality of functional layers. The motherboard body 1 to be cut may be a single-layer motherboard, as shown in FIG. 5a. Alternatively, the motherboard body 1 to be cut may be a combined motherboard of multiple functional layers, as shown in FIG. 5b, and it comprises a motherboard base 1a and first, second and third functional layers 1b, 1c and 1d. Structure of the motherboard to be cut is not limited as long as the cutting can be implemented, increasing diversity of the motherboard to be cut.

Figure 4A:
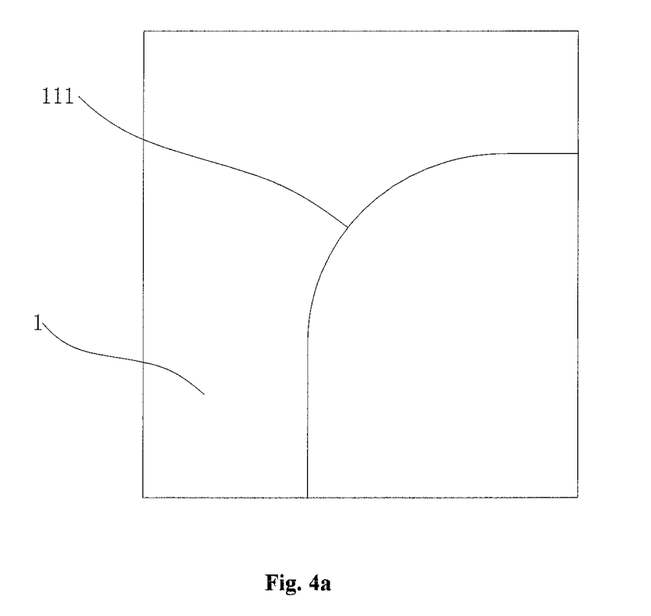
FIG. 4a is a schematic view showing a first type of special-shaped cutting line section according to an embodiment of the present disclosure.
Figure 4B:
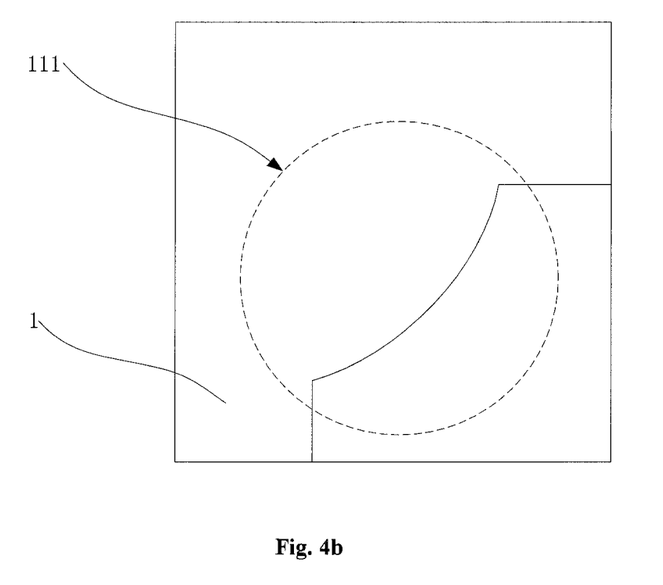
FIG. 4b is a schematic view showing a second type of special-shaped cutting line section according to an embodiment of the present disclosure.
Figure 4C:
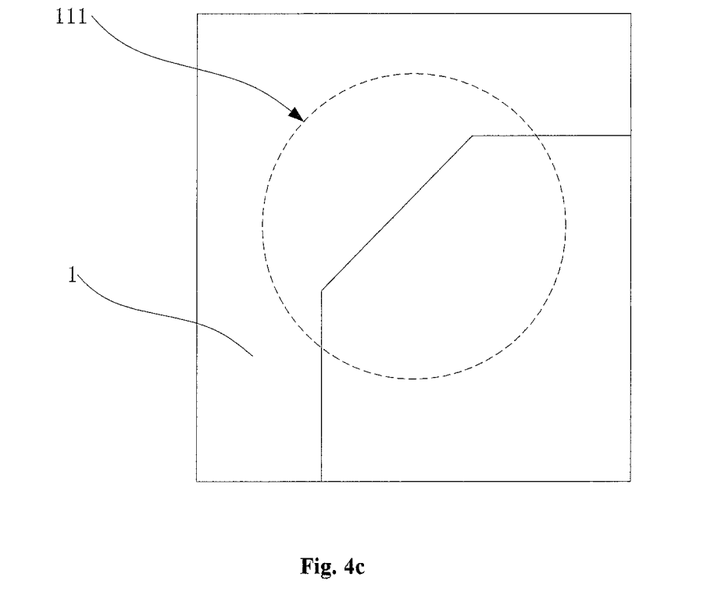
FIG. 4c is a schematic view showing a third type of special-shaped cutting line section according to an embodiment of the present disclosure.

In some embodiments, in the cutting line 11, the special-shaped cutting line section 111 is a curve-type cutting line segment, as shown in FIG. 4a; or, the special-shaped cutting line section 111 is a special-type cutting line section 111 including a curve-type cutting line segment and a straight-type cutting line segment, as shown in FIG. 4b; or else, the special-shaped cutting line section 111 is a special-type cutting line section 111 including a plurality of straight-type cutting line segments, as shown in FIG. 4c. The cutting line 11 may have different shapes due to different requirements on profile of the product. The cutting line 11 may be various combinations of the line types, increasing diversity of the product. In addition, the first marker assembly 121 and the second marker assembly 122 may be provided to satisfy different line types of the cutting line 11, which facilitates accurate detection of the cutting accuracy of certain portion of a product.

Figure 3:
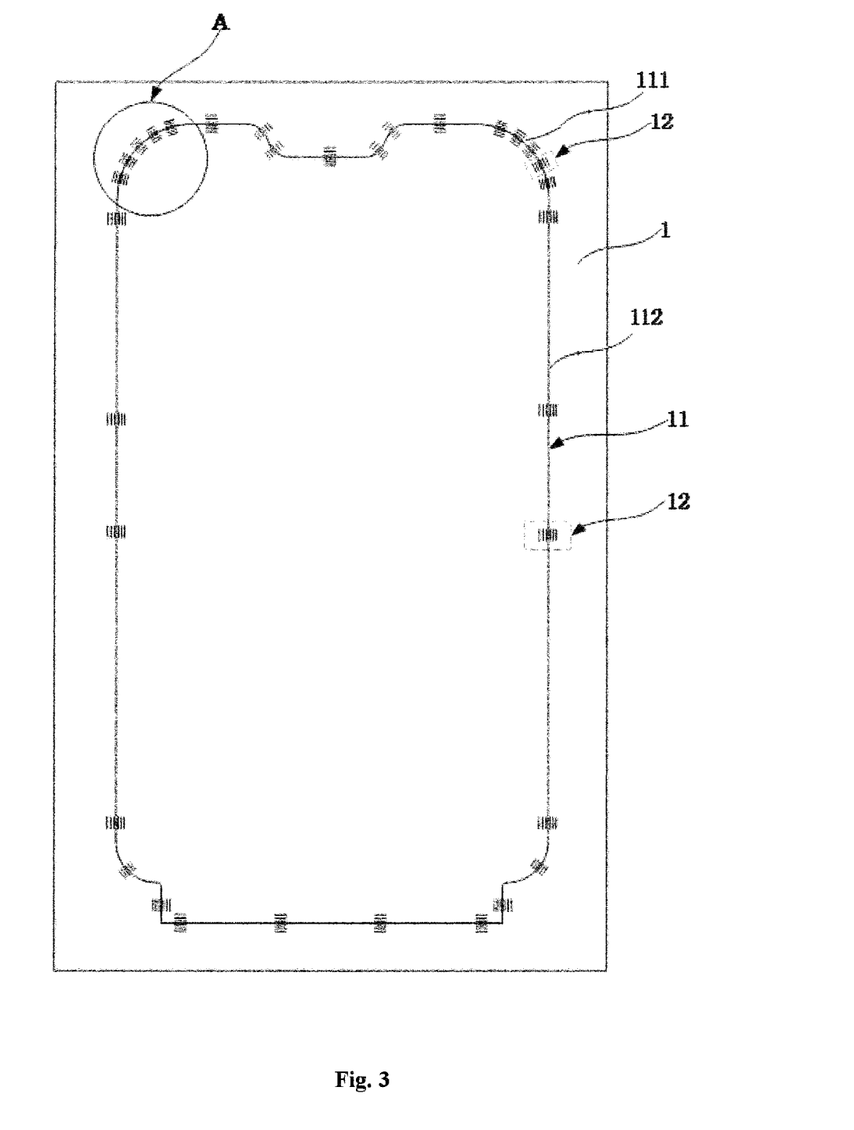
FIG. 3 is a front view showing another motherboard to be cut according to an embodiment of the present disclosure.

Referring to FIG. 3, in the motherboard to be cut, the cutting line 11 of the motherboard body 1 further comprises a normal cutting line section 112, and a plurality of positional marker groups 12 are also provided on a portion of the surface where the normal cutting line section is provided. The plurality of positional marker groups 12 are distributed in an extension direction where the normal cutting line section 112 is in. Similar to the positional marker groups 12 at the place of the special-shaped cutting line section 111 shown in FIG. 1 and FIG. 2, each of the plurality of positional marker groups 12 shown in FIG. 3 further comprises a first marker assembly provided at one side of the normal cutting line section and a second marker assembly provided at the other side of the normal cutting line section; a space for passing the normal cutting line section therethrough is provided between the first marker assembly and the second marker assembly; the first marker assembly and the second marker assembly each comprise scale marks distributed in an arrangement direction of the first marker assembly and the second marker assembly; and, in the arrangement direction of the first marker assembly and the second marker assembly, a size of the first marker assembly is not less than a tolerance size of a side of the normal cutting line section where the first marker assembly is in when the normal cutting line section is cut, and a size of the second marker assembly is not less than a tolerance size of a side of the normal cutting line section where the second marker assembly is in when the normal cutting line section is cut. The normal cutting line section 112 described herein is a section of the cutting line 11 that has a simple line type and is easy to be cut, for example a straight-shaped section of the cutting line 11. In this way, when cutting the motherboard, it is simpler to cut the straight-shaped section than the special-shaped cutting line section of the cutting line 11. Provision of the positional marker groups 12 on the straight-shaped section of the cutting line 11 facilitates detection of the cutting accuracy and is advantageous on improving cutting quality of a product obtained after the cutting.

According to embodiments of the present disclosure, there is also provided a method of manufacturing a substrate, and the method being implemented on the motherboard to be cut of any one of the above embodiments. The method of manufacturing a substrate will be described in conjunction with the structures shown in FIG. 1 and FIG. 2. A method of manufacturing a substrate comprises the following steps of:

before cutting the motherboard to be cut, forming, on the surface of the motherboard body 1, the cutting line 11 comprising the special-shaped cutting line section 111;

forming the plurality of positional marker groups 12 on the portion of the surface, where the special-shaped cutting line section 111 is provided, of the motherboard body 1; wherein, the plurality of positional marker groups 12 are distributed in a direction in which the special-shaped cutting line section 111 extends, each of the plurality of positional marker groups 12 comprises a first marker assembly 121 provided at one side of the special-shaped cutting line section and a second marker assembly 122 provided at the other side of the special-shaped cutting line section; a space 120 for passing the special-shaped cutting line section 111 therethrough is provided between the first marker assembly 121 and the second marker assembly 122; the first marker assembly 121 and the second marker assembly 122 each comprise scale marks distributed in an arrangement direction of the first marker assembly 121 and the second marker assembly 122; and, in the arrangement direction of the first marker assembly 121 and the second marker assembly 122, a size of the first marker assembly 121 is not less than a tolerance size of a side of the special-shaped cutting line section 111 where the first marker assembly 121 is in when the special-shaped cutting line section 111 is cut, and a size of the second marker assembly 122 is not less than a tolerance size of a side of the special-shaped cutting line section 111 where the second marker assembly 122 is in when the special-shaped cutting line section 111 is cut;

cutting the motherboard along the cutting line 11, to form the substrate;

determining a cutting accuracy by observing relative position(s) between the first marker assembly 121 and/or the second marker assembly 122 of each of the plurality of positional marker groups 12 and corresponding cutting edge(s), and evaluating a cutting quality of the substrate in accordance with the cutting accuracy.

With the method of manufacturing a substrate, after completing the cutting along the cutting line, a cutting accuracy of the substrate can be quantitatively detected by observing relative position between the cutting edge and the scale mark. Thus, cutting quality of the substrate can be effectively evaluated, and it is beneficial to the defective analysis at later stage. In addition, the detection is intuitive, efficient, convenient and simple.

Specifically, the step of determining a cutting accuracy by observing relative position(s) between the first marker assembly 121 and/or the second marker assembly 122 of each of the plurality of positional marker groups 12 and corresponding cutting edge(s) comprises: obtaining an actual value for cutting deviation by observing relative position(s) between the cutting edge(s) and the corresponding scale marks of the first marker assembly 121 and/or the second marker assembly 122; and comparing the actual value with a preset value for cutting deviation, to obtain the cutting accuracy. For example, as shown in FIG. 1 and FIG. 2, in the substrate after the cutting, the first marker assembly 121 is provided at a side of the cutting line 11 towards a center of the substrate, while the second marker assembly 122 is provided at a side of the cutting line 11 away from the center of the substrate. During a cutting, if an actual cutting trajectory is located on the side of the cutting line 11 towards the center of the substrate, that is, if a portion of the motherboard with the second marker assembly 122 is completely cut off, an actual value for cutting deviation can be obtained only by observing the relative position between the cutting edge and the scale mark of first marker assembly 121 to see which strip-shaped mark 1211 is aligned with or closes to the cutting edge. Then, the actual value is compared with a preset value for cutting deviation, to obtain the cutting accuracy. The abovementioned method of obtaining the cutting accuracy is simple and direct, and the accuracy is high.

According to embodiments of the present disclosure, there is further provided a method of detecting a cutting accuracy of a substrate. The substrate is obtained by cutting the motherboard to be cut according to any one of the abovementioned embodiments of the present disclosure along the cutting line 11. The method of detecting a cutting accuracy of a substrate comprises: determining a cutting accuracy by observing relative position(s) between the first marker assembly 121 and/or the second marker assembly 122 of each of the plurality of positional marker groups 12 and corresponding cutting edge(s), and evaluating a cutting quality of the substrate in accordance with the cutting accuracy.

With the abovementioned method of detecting a cutting accuracy of a substrate, a cutting accuracy of the substrate can be quantitatively detected by observing relative position between the cutting edge and the scale mark. Thus, cutting quality of the substrate can be effectively evaluated, and it is beneficial to the defective analysis at later stage. In addition, the detection is intuitive, efficient, convenient and simple.

It will be apparent for those skilled in the art that various changes or modifications on these embodiments of the present disclosure may be made in these embodiments without departing from the principles and spirit of the present disclosure. In this way, the present disclosure intends to contain these changes or modifications if they are included within the scope of the present disclosure and the scope of which is defined in the claims and their equivalents.

What is claimed is:

1. A motherboard to be cut, comprising: a motherboard body provided, on a surface thereof, with a cutting line comprising a special-shaped cutting line section, wherein,
a plurality of positional marker groups are provided on a portion of the surface where the special-shaped cutting line section is provided, and the plurality of positional marker groups are distributed in an extension direction where the special-shaped cutting line section is in;
each of the plurality of positional marker groups comprises a first marker assembly provided at one side of the special-shaped cutting line section and a second marker assembly provided at the other side of the special-shaped cutting line section; a space for passing the special-shaped cutting line section therethrough is provided between the first marker assembly and the second marker assembly; the first marker assembly and the second marker assembly each comprise scale marks distributed in an arrangement direction of the first marker assembly and the second marker assembly; and, in the arrangement direction of the first marker assembly and the second marker assembly, a size of the first marker assembly is not less than a tolerance size of a side of the special-shaped cutting line section where the first marker assembly is in when the special-shaped cutting line section is cut, and a size of the second marker assembly is not less than a tolerance size of a side of the special-shaped cutting line section where the second marker assembly is in when the special-shaped cutting line section is cut.

2. The motherboard to be cut of claim 1, wherein, in each of the plurality of positional marker groups, a midline of the space along the extension direction where the special-shaped cutting line section is in coincides with a portion of the special-shaped cutting line section between the first marker assembly and the second marker assembly.

3. The motherboard to be cut of claim 1, wherein, in each of the plurality of positional marker groups, the scale marks of each of the first marker assembly and the second marker assembly comprise a plurality of strip-shaped marks arranged in the arrangement direction of the first marker assembly and the second marker assembly and distributed separately from one another and each extending parallel to an extension direction where the space is in.

4. The motherboard to be cut of claim 3, wherein, in each of the plurality of positional marker groups,
a distance between any two adjacent ones of the strip-shaped marks of the first marker assembly is ranged between 1 μm~25 μm; and
a distance between any two adjacent ones of the strip-shaped marks of the second marker assembly is ranged between 1 μm~25 μm.

5. The motherboard to be cut of claim 4, wherein, in each of the plurality of positional marker groups, the distance between any two adjacent ones of the strip-shaped marks of the first marker assembly and the distance between any two adjacent ones of the strip-shaped marks of the second marker assembly are equal to each other.

6. The motherboard to be cut of claim 4, wherein, in each of the plurality of positional marker groups, a size of each of the strip-shaped marks in the extension direction where the space is in is ranged between 100 μm~300 μm; and a size of each of the strip-shaped marks in the arrangement direction of the first marker assembly and the second marker assembly is ranged between 45 μm~55 μm.

7. The motherboard to be cut of claim 1, wherein, the motherboard body is a single-layer motherboard or a combined motherboard of multiple functional layers.

8. The motherboard to be cut of claim 1, wherein, in the cutting line, the special-shaped cutting line section is a curve-type cutting line segment; or the special-shaped cutting line section is a special-type cutting line section including a curve-type cutting line segment and a straight-type cutting line segment; or the special-shaped cutting line section is a special-type cutting line section including a plurality of straight-type cutting line segments.

9. The motherboard to be cut of claim 1, wherein, the cutting line comprises a profile cutting line for formation of a profile of a product and a groove cutting line for formation of a groove in the product.

10. The motherboard to be cut of claim 1, wherein, in each of the plurality of positional marker groups, the scale marks of each of the first marker assembly and the second marker assembly comprise a plurality of circular marks arranged in the arrangement direction of the first marker assembly and the second marker assembly and distributed separately from one another.

* * * * *